United States Patent [19]

Langendorf

[11] Patent Number: 5,553,275
[45] Date of Patent: Sep. 3, 1996

[54] METHOD AND APPARATUS FOR SYNCHRONOUSLY DETECTING PHASE RELATIONSHIPS BETWEEN A HIGH-FREQUENCY CLOCK AND A LOW-FREQUENCY CLOCK

[75] Inventor: Brian K. Langendorf, El Dorado Hills, Calif.

[73] Assignee: Intel Corporation, Santa Clara, Calif.

[21] Appl. No.: 90,592

[22] Filed: Jul. 13, 1993

[51] Int. Cl.⁶ .................................................. G06F 1/12
[52] U.S. Cl. ............................ 395/550; 364/DIG. 1; 364/271; 364/271.4; 364/271.9
[58] Field of Search ............................................... 395/550

[56] References Cited

U.S. PATENT DOCUMENTS

| | | | |
|---|---|---|---|
| 3,708,686 | 1/1973 | Butler, Jr. et al. | 307/149 |
| 4,405,945 | 9/1983 | Sato | 358/154 |
| 4,593,253 | 6/1986 | McCabe et al. | 331/1 A |
| 4,599,570 | 6/1986 | Cloke | 328/155 |
| 5,120,990 | 6/1992 | Koker | 307/269 |
| 5,126,602 | 6/1992 | Lee et al. | 307/510 |
| 5,315,183 | 5/1994 | Ruotsalainen | 307/511 |
| 5,317,715 | 5/1994 | Johnson et al. | 395/425 |
| 5,329,559 | 7/1994 | Wong et al. | 375/119 |
| 5,347,559 | 9/1994 | Hawkins et al. | 377/54 |
| 5,371,880 | 12/1994 | Bhattacharya | 395/550 |
| 5,388,250 | 2/1995 | Lewis et al. | 395/550 |

OTHER PUBLICATIONS

Marston, Ray, "Working With Flip Flops", Radio–Electronics Magazine, Jun. 1987, p. 65.

Primary Examiner—Kevin A. Kriess
Assistant Examiner—St. John Courtenay, III
Attorney, Agent, or Firm—Blakely, Sokoloff, Taylor & Zafman

[57] ABSTRACT

An apparatus for synchronously detecting phase relationships between a high-frequency clock and a low-frequency clock that are substantially synchronous. The low-frequency clock is frequency divided-by-two generate a Lfdiv2 signal. The Lfdiv2 signal is synchronously delayed by one phase of the high-frequency clock to generate a dLFdiv2 signal. The LFdiv2 and dLFdiv2 signals are compared an XOR gate to generate a PH1 signal. A rising-edge of the PH1 signal indicates that a rising-edge of the high-frequency clock corresponds to a rising-edge of the low-frequency clock. This phase information allows enhanced communication between state machines or buses that are operating at different frequencies.

4 Claims, 4 Drawing Sheets

Figure 1
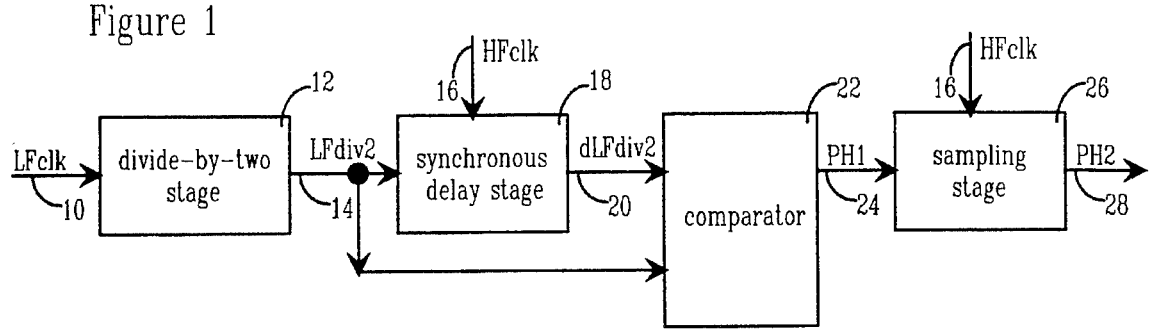
Figure 2
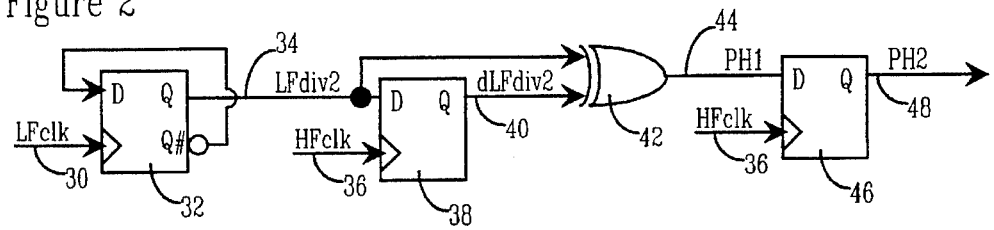
Figure 3  Frequency of HFclk = 2 X Frequency of LFclk
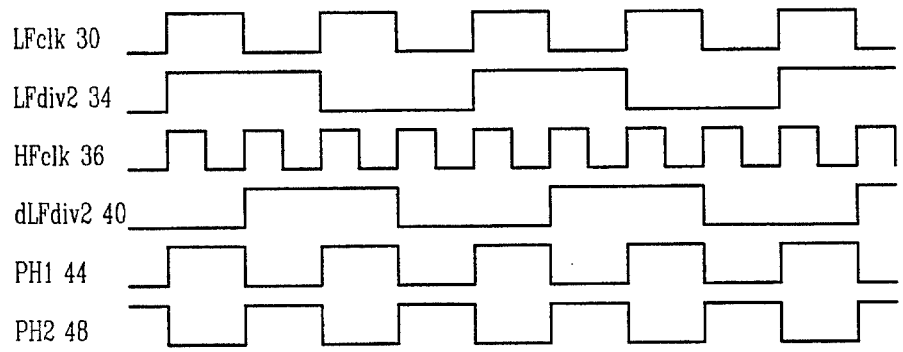
Figure 4  Frequency of HFclk = 3 X Frequency of LFclk
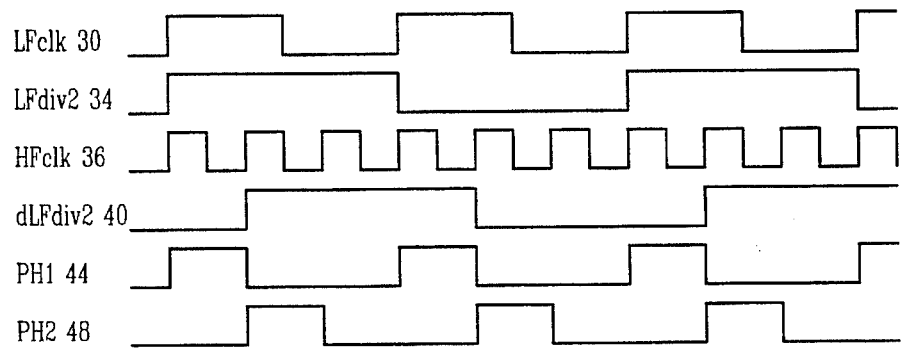

Figure 5
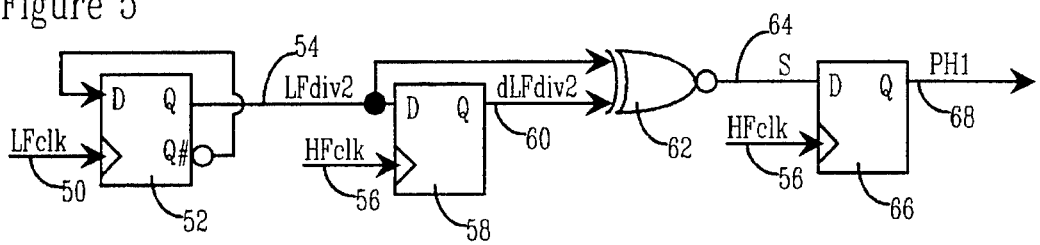
Figure 6  Frequency of HFclk = 3/2 X Frequency of LFclk
Case I:  LFdiv2 is low when HFclk and LFclk share a rising edge.
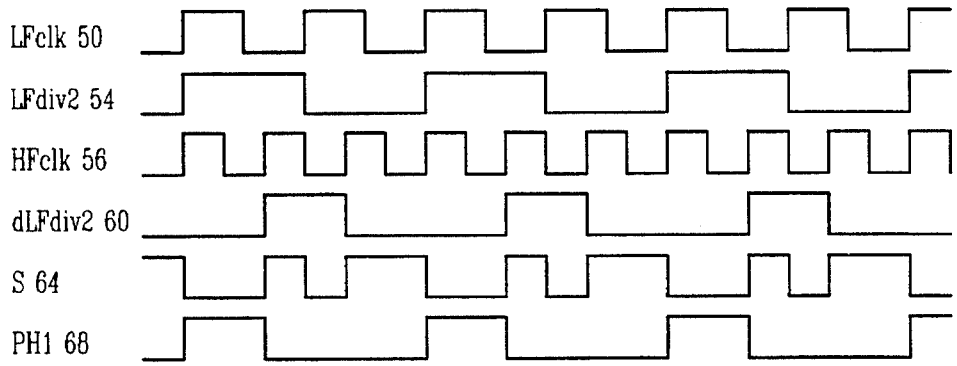
Figure 7  Frequency of HFclk = 3/2 X Frequency of LFclk
Case II: LFdiv2 is high when HFclk and LFclk share a rising edge.
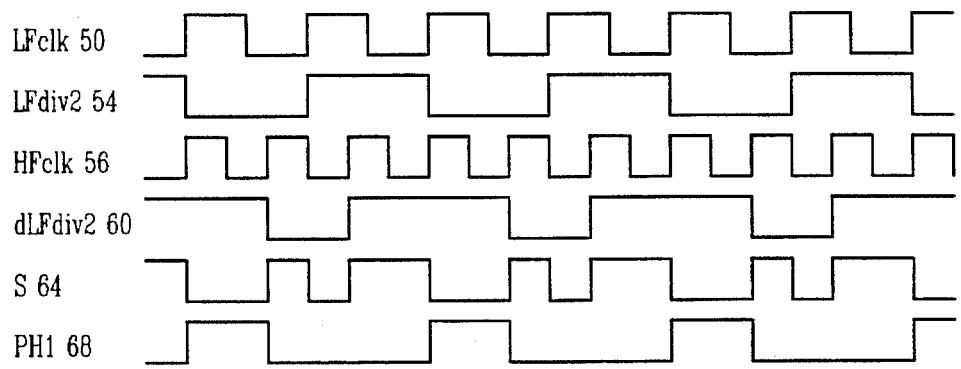

METHOD AND APPARATUS FOR SYNCHRONOUSLY DETECTING PHASE RELATIONSHIPS BETWEEN A HIGH-FREQUENCY CLOCK AND A LOW-FREQUENCY CLOCK

BACKGROUND OF THE INVENTION

1. Field of the Invention

The present invention relates generally to phase detection circuits and more specifically to synchronous phase detection circuits for detecting phase relationships between clock signals having either an integer multiple, n:1, or a 3:2 (meaning three period of the high-frequency clock for every 2 periods of the low-frequency clock) frequency relationship.

2. Prior Art

Today's microprocessors and computers utilize multiple buses and functional logic blocks that may operate at different frequencies. To facilitate the transfer of data between units operating at different frequencies, it is helpful to know the phase relationship between the clocks of the individual units. For example, a first state machine may operate at 66 MHz and a second state machine at 33 MHz. After sending a request to the second state machine, the first state machine must know when the second state machine has taken the request. Suppose that the first state machine knows that the second state machine will take a request on the first rising-edge of its clock after receiving the request. In this case, detecting when the rising-edges of the lower frequency clock occur with respect to the higher frequency clock allows the first state machine to know when the request will be taken by the second state machine.

Asynchronous phase detection circuits for detecting phase relationships between clocks having a 2:1 frequency relationship are known. An asynchronous phase detector circuit for detecting the phase relationship between a high-frequency clock that is twice the frequency of a low-frequency clock uses an asynchronous delay unit and a D flip-flop. The asynchronous delay unit, which is typically a chain of inverters, receives the low-frequency clock as an input and generates a delayed low-frequency clock signal. The D flip-flop receives the delayed low-frequency clock signal at its D input and the high-frequency clock at its clock input such that on a rising-edge of the high-frequency clock, the delayed low-frequency clock is sampled to create a sampled delayed low-frequency clock signal at the Q output of the D flip-flop. In the case of a 2:1 frequency relationship, a falling-edge on the sampled delayed low-frequency clock signal indicates that a rising-edge of the high-frequency clock corresponds to a rising-edge of the low-frequency clock.

Two problems with this asynchronous phase detector circuit are: 1) it does not generalize to any integer multiple frequency relationship between the low and high frequency clocks and 2) substantial control of the amount of delay inserted by the asynchronous delay unit is required. The second problem involves controlling the asynchronous delay such that the delayed low frequency signal meets the setup-time and hold-time requirements of the D flip-flop. The asynchronous delay must meet these timing requirements when the circuit is operated over specified temperature and voltage ranges taking into account the process variations in manufacturing the delay circuit.

Attaining sufficient control of the amount of asynchronous delay becomes more difficult at higher clock frequencies. This fact highlights the delay control problem because the steady trend in the electronics industry is to increase the clock speeds of electronic devices in order to satisfy the demand for increased performance. This is especially true for microprocessors and computers.

In addition, since microprocessors and computers are synchronous machines, a synchronous phase detection circuit would be the most straightforward implementation for use in microprocessors and computer systems.

Therefore, a method and apparatus for synchronously detecting phase relationships between a low-frequency and a high-frequency clock is needed.

SUMMARY OF THE INVENTION

The present invention is drawn to a system, method, and apparatus for synchronously detecting phase relationships between a high-frequency clock and a low-frequency clock.

The apparatus detects phase relationships between a low-frequency clock and a high-frequency clock. In one embodiment, the invention comprises a divide-by-two stage, a synchronous delay stage, and a comparator. The divide-by-two stage receives the low-frequency clock signal as an input and generates a first signal that is one-half the frequency of the low-frequency clock. The synchronous delay stage receives the high-frequency clock and the first signal as inputs and generates a second signal that is synchronously delayed with respect to the first signal by at least one period of the high-frequency clock. The comparator receives the first signal and the second signal as inputs and generates a first phase signal that has a first value and a second value. The first phase signal indicates that a first transition of the low-frequency clock corresponds to a second transition of the high-frequency clock when the first phase signal changes from the first value to the second value.

In another embodiment a sampling stage is added. The sampling stage receives the first phase signal and the low-frequency clock, samples the first phase signal when the low-frequency clock has a third value, and generates a second phase signal that has the sampled value of the first phase signal.

BRIEF DESCRIPTION OF THE DRAWINGS

FIG. 1 is a block diagram of the present invention.

FIG. 2 is a schematic representation of a first embodiment of the present invention for detecting phase relationships between clock signals having an integer multiple frequency relationship.

FIG. 3 is a timing diagram illustrating the operation of the first embodiment of FIG. 2 when HFclk, the high-frequency clock, is two times the frequency of LFclk, the low-frequency clock.

FIG. 4 is a timing diagram illustrating the operation of the first embodiment of FIG. 2 when HFclk, the high-frequency clock, is three times the frequency of LFclk, the low-frequency clock.

FIG. 5 is a schematic representation of a second embodiment of the present invention for detecting phase relationships between clock signals having a 3:2 frequency relationship.

FIG. 6 is a timing diagram illustrating the operation of the second embodiment of FIG. 5 in a first case.

FIG. 7 is a timing diagram illustrating the operation of the second embodiment of FIG. 5 in a second case.

DETAILED DESCRIPTION OF THE INVENTION

Figure 8:
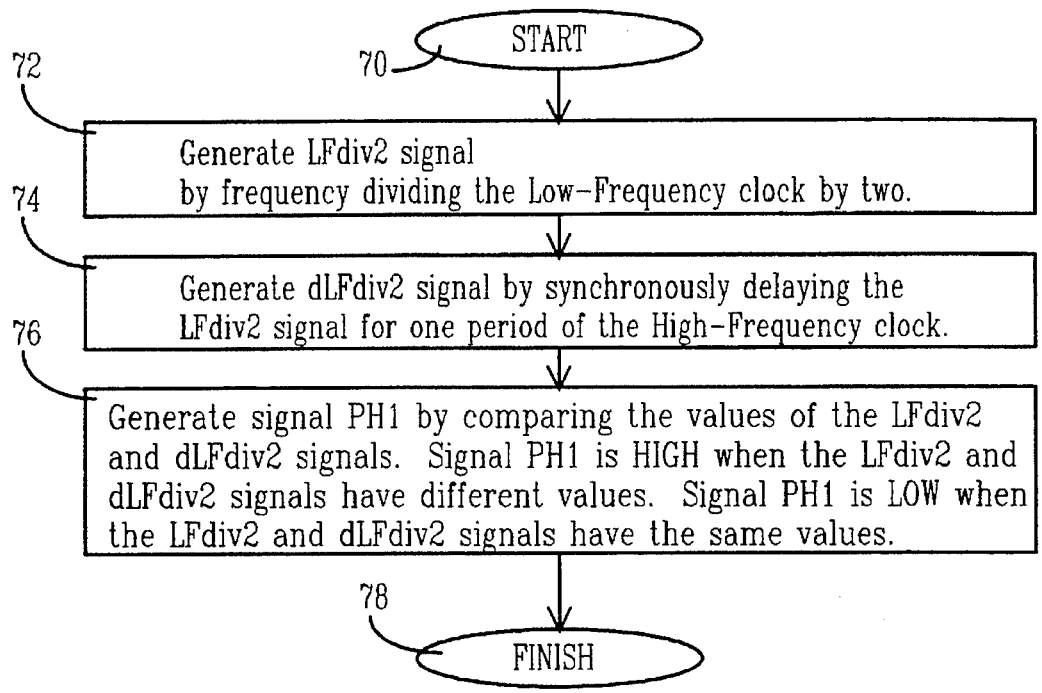
FIG. 8 is a flowchart of the operation of the first embodiment of FIG. 2.

A method and apparatus for synchronously detecting phase relationships between a high-frequency clock and a low-frequency clock is described. An implementation of the apparatus in a computer system is also described. In the following description, numerous specific details are set forth in order to provide a thorough understanding of the present invention. It will be apparent, however, to one skilled in the art that the present invention may be practiced without these specific details. In other instances, well-known methods and circuits are shown in block diagram form in order not to obscure the present invention unnecessarily. It is understood that the present invention is comprised of transistor circuits that are readily manufacturable using well known complimentary metal-oxide semiconductor (CMOS) technology, or other semiconductor manufacturing processes.

FIG. 1 is a block diagram of the present invention. A divide-by-two stage 12 receives a low-frequency clock, LFclk clock 10, and generates a LFdiv2 signal 14 that is one-half the frequency of the LFclk clock 10. A synchronous delay stage 18 receives the LFdiv2 signal 14 and a high-frequency clock, HFclk clock 16, and generates a dLFdiv2 signal 20 that has the same frequency as the LFdiv2 signal 14, but is synchronously delayed with respect to the LFdiv2 signal 14 by one period of the HFclk clock 16. A comparator 22 receives the LFdiv2 signal 14 and the dLFdiv2 signal 20 as inputs and generates a PH1 signal 24 that indicates a first phase relationship of the LFclk clock 10 and the HFclk clock 16. A sampling stage 26 receives the PH1 signal 24 and the HFclk clock 16 and generates a PH2 signal 28 by sampling the value of the PH1 signal 24 with the HFclk clock 16. The PH2 signal 28 provides additional phase information as will be further explained.

For proper operation, the present invention requires that the HFclk clock 16 and the LFclk clock 10 have either an integer multiple, n:1 (n being an integer) or a 3:2 (3:2 meaning that there are 3 periods of the HFclk clock 16 for every 2 periods of the LFclk clock 10) frequency relationship, and that they be substantially synchronous (meaning that their corresponding rising or falling edges occur at substantially the same time).

Referring now to FIG. 2, a schematic representation of a first embodiment of the present invention is shown. The first embodiment detects the phase relationship between a low-frequency clock, LFclk clock 30, and a high-frequency clock, HFclk clock 36, that has a frequency that is an integer multiple, n:1, of the frequency of the LFclk clock 30. A first D flip-flop 32 is connected as a rising-edge divide-by-two circuit by connecting the Q# (Q# meaning complement of Q, i.e. Q is a non-inverting output and Q# is an inverting output) output to the D input. The D flip-flop 32 receives the LFclk clock 30 at its clock input and generates a LFdiv2 signal 34 at its Q output that is one-half the frequency of the LFclk clock 30. A second D flip-flop 38 receives the LFdiv2 signal 34 at its D input and the HFclk clock 36 at its clock input and generates a dLFdiv2 signal 40 at its Q output. The dLFdiv2 40 signal has the same frequency as the LFdiv2 signal 34, but is synchronously delayed with respect to the LFdiv2 signal 34 by one period of the HFclk clock 36. An XOR gate 42 receives the LFdiv2 signal 34 and the dLFdiv2 signal 40 as inputs and generates a PH1 signal 44 at its output. The PH1 signal 44 indicates a first phase relationship between the LFclk 30 and HFclk 36 clocks. A rising-edge of the PH1 signal 44 indicates that a rising-edge of the HFclk clock 36 corresponds to a rising-edge of the LFclk clock 30. In other words, a low level of the PH1 signal 44 indicates that the next rising-edge of the LFclk clock 30 is also a rising edge of the HLFclk clock 36. A third D flip-flop 46 receives the PH1 signal 44 at its D input and the HFclk clock 36 at its clock input and generates a PH2 signal 48 at its Q output. The PH2 signal 48 indicates a second phase relationship between the LFclk 30 and HFclk 36 clocks. A rising-edge of the PH2 signal 48 corresponds to the next rising-edge of the HFclk clock 36 after the rising-edge of the HFclk clock 36 corresponding to the rising-edge of the LFclk clock 30. This information is meaningful when the integer multiple frequency ratio is greater than 2. It is understood that additional D flip-flops can be "chained" to extract additional information about the phase relationships as needed.

The operation of the first embodiment of FIG. 2 is now described with reference to the timing diagrams of FIGS. 3 and 4.

FIG. 3 shows timing diagrams for the first embodiment of FIG. 2 when the HFclk clock 36 is twice the frequency (2:1) of the LFclk clock 30. The first D flip-flop 32 frequency divides-by-two the LFclk clock 30 to generate the LFdiv2 signal 34. The second D flip-flop 38 samples the LFdiv2 signal 34 when the HFclk clock 36 is low and drives the sampled value on the Q output at each rising-edge of the HFclk clock 36 to generate the dLFdiv2 signal 40. In effect, the second D flip-flop 38 generates the dLFdiv2 signal 40 by synchronously delaying the LFdiv2 signal 34 by one period of the HFclk clock 36. The XOR gate 42 drives the PH1 signal 44 high when the LFdiv2 34 and dLFdiv2 40 signals have different values and low when the LFdiv2 34 and dLFdiv2 40 signals have the same value. A rising-edge of the PH1 signal 44 occurs when a rising-edge of the LFclk clock 30 corresponds to a rising edge of the HFclk clock 36. Therefore, a rising-edge of the PHI signal 44 indicates a first phase relationship between the two clocks. In other words, a low level of the PH1 signal 44 indicates that the next rising-edge of the LFclk clock 30 is also a rising edge of the HLFclk clock 30.

This phase relationship information can be used to allow state machine, buses, microprocessors, etc., operating at the HFclk and LFclk frequencies to exchange information. For example, a first state machine may operate from a 66 MHz clock, i.e. a high-frequency clock, and a second state machine from a 33 MHz clock, i.e. a low-frequency clock. After sending a request to the second state machine, the first state machine must know when the second state machine has taken the request. Suppose that the first state machine knows that the second state machine will take a request on the first rising-edge of its low-frequency clock after receiving the request. In this case, detecting when the rising-edges of the low-frequency clock occur with respect to the high-frequency clock allows the first state machine to know when the request will be taken by the second state machine. The PH1 signal provides the first state machine with this information. When the PH1 signal is low, the first state machine knows that the request will be taken by the second state machine on the next rising-edge of its high-frequency clock.

FIG. 4 shows timing diagrams for the first embodiment of FIG. 2 when the HFclk clock 36 is three times (3:1) the frequency of the LFclk clock 30. The operation is similar to that of the 2:1 case that was just described. In the 3:1 case, however, the utility of the third D flip-flop 46 is seen. Again, a rising-edge of the PH1 signal 44 indicates that a rising-edge of the LFclk clock 30 corresponds to a rising edge of the HFclk clock 36. (And again, a low level of the PH1 signal 44 also indicates that the next rising-edge of the LFclk clock 30 is also a rising edge of the HFclk clock 36.) The third D flip-flop 46 samples the PH1 signal 44 when the HFclk clock 36 is low and drives the sampled value on the Q output at each rising-edge of the HFclk clock 36 to generate the PH2 signal 48. In effect, the third D flip-flop 46 generates the PH2 signal 48 by synchronously delaying the PH1 signal 44 by one period of the HFclk clock 36. The PH2 signal 48 provides additional phase information. A rising-edge of the PH2 signal 48 indicates the next rising-edge of the HFclk clock 36 after the rising-edge of the HFclk clock 36 corresponding to the rising-edge of the LFclk clock 30. It is understood that additional D flip-flop stages can be added as appropriate to extract additional phase information about various rising-edges of the HFclk clock 36 with respect to the LFclk clock 30.

Referring now to FIG. 5, a schematic representation of a second embodiment of the present invention is shown. The second embodiment detects the phase relationship between a high-frequency clock, HFclk clock 56, and a low-frequency clock, LFclk clock 50, that have a 3:2 frequency relationship. A first D flip-flop 52 is connected as a rising-edge divide-by-two circuit by connecting the Q# output to the D input. The D flip-flop 52 receives the LFclk clock 50 at its clock input and generates a LFdiv2 signal 54 at its Q output that is one-half the frequency of the LFclk clock 50. A second D flip-flop 58 receives the LFdiv2 signal 54 at its D input and the HFclk clock 56 at its clock input and generates a dLFdiv2 signal 60 at its Q output. The dLFdiv2 60 signal has the same frequency as the LFdiv2 signal 54, but is synchronously delayed with respect to the LFdiv2 signal 54 by one period of the HFclk clock 56. An XNOR gate 62 receives the LFdiv2 signal 54 and the dLFdiv2 signal 60 as inputs and generates a S signal 64 at its output. A third D flip-flop 66 receives the S signal 64 at its D input and the HFclk clock 56 at its clock input and generates a PH1 signal 68 at its Q output. The PH1 signal 68 indicates a first phase relationship between the LFclk 50 and HFclk 56 clocks. A rising-edge of the PH1 signal 68 occurs when the rising-edge of the HFclk clock 56 corresponds to the rising-edge of the LFclk clock 50. In other words, a low level of the PH1 signal 68 indicates that the next rising-edge of the LFclk clock 50 is also a rising edge of the HFclk clock 56. As in the circuit of FIG. 2, it is understood that additional D flip-flops can be "chained" after PH1 to extract additional phase relationship information.

The operation of the second embodiment of FIG. 5 is now described with reference to the timing diagrams of FIGS. 6 and 7. FIG. 6 shows a first case where the LFdiv2 signal 54 is low when the HFclk 56 and LFclk 50 clocks share a rising edge. FIG. 7 shows a second case where the LFdiv2 signal 54 is high when the HFclk 56 and LFclk 50 clocks share a rising edge. As the timing diagrams show, the phase information detected by the circuit of FIG. 5 is the same in both cases.

FIG. 6 shows timing diagrams for the second embodiment of FIG. 5 in a first case where the LFdiv2 signal 54 is low when the HFclk 56 and LFclk 50 clocks share a rising-edge. The first D flip-flop 52 frequency divides-by-two the LFclk clock 50 to generate the LFdiv2 signal 54. The second D flip-flop 58 samples the LFdiv2 signal 54 when the HFclk clock 56 is low and drives the sampled value on the Q output at each rising-edge of the HFclk clock 56 to generate the dLFdiv2 signal 40. In effect, the second D flip-flop 58 generates the dLFdiv2 signal 40 by synchronously delaying the LFdiv2 signal 54 by one period of the HFclk clock 56. The XNOR gate 64 drives the S signal 64 high when the LFdiv2 54 and dLFdiv2 60 signals have the same value and low when the LFdiv2 54 and dLFdiv2 60 signals have different values. A third D flip-flop 66 receives the S signal 64 at its D input and the HFclk clock 56 at its clock input and generates a PH1 signal 68 at its Q output. A rising-edge of the PH1 signal 68 occurs when a rising-edge of the LFclk clock 50 corresponds to a rising edge of the HFclk clock 56. In other words, a low level of the PH1 signal 68 indicates that the next rising-edge of the LFclk clock 50 is also a rising edge of the HFclk clock 56. Therefore, a rising-edge of the PH1 signal 68 indicates a first phase relationship between the two clocks. The phase relationship information provided by the PH1 signal can be used to allow state machine, buses, microprocessors, etc., operating at the HFclk and LFclk frequencies to exchange information as already described in connection with FIG. 2.

FIG. 7 shows timing diagrams for the second embodiment of FIG. 5 in a second case where the LFdiv2 signal 54 is high when the HFclk 56 and LFclk 50 clocks share a rising-edge. In this case, the PH1 signal 68 again indicates the same phase information.

Operation of the Present Invention

Figure 9:
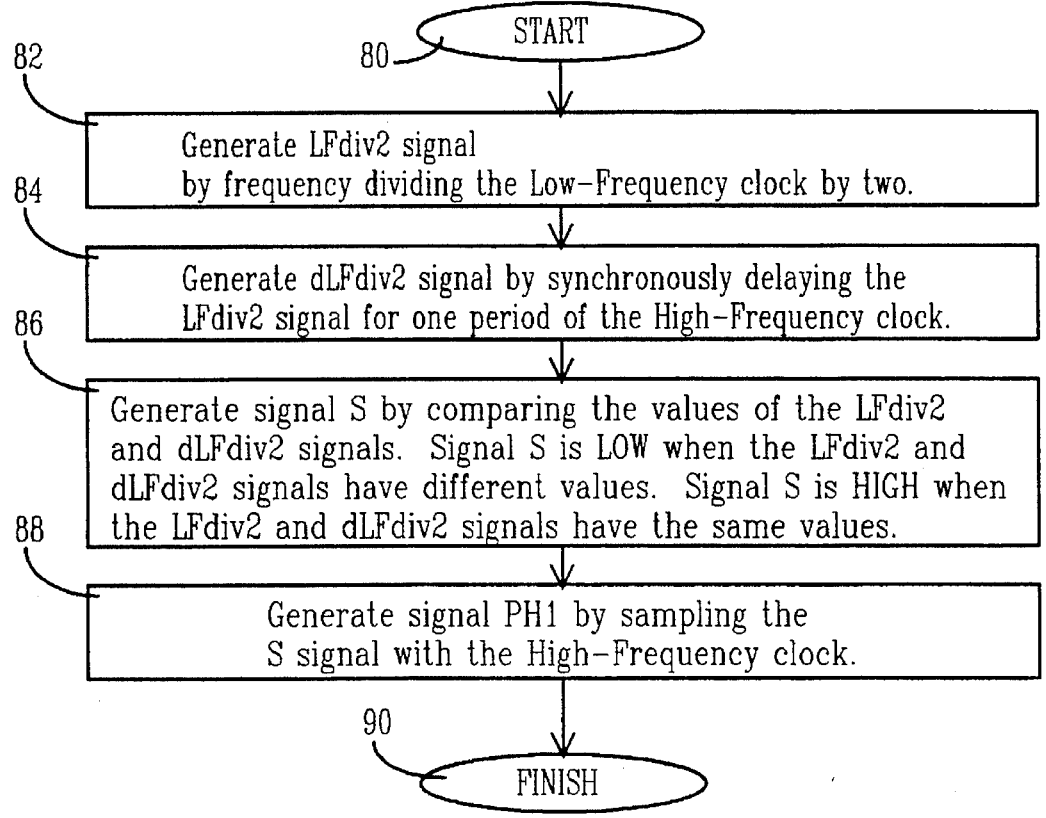
FIG. 9 is a flowchart of the operation of the second embodiment of FIG. 5.

In its overall operation, the present invention provides synchronous detection of phase relationships between a high-frequency clock and a low-frequency clock that have either an integer multiple, n:1, or a 3:2 frequency relationship. The method of the present invention assumes that the high-frequency and low-frequency clocks are substantially synchronous, meaning that their corresponding rising or falling edges occur at substantially the same time. The major functions of the present invention operate according to the flow diagrams illustrated in FIGS. 8 and 9. FIG. 8 illustrates the method of the present invention for detecting phase relationships between clocks having an integer multiple, n:1, frequency relationship. FIG. 9 illustrates the method of the present invention for detecting phase relationships between clocks having a 3:2 frequency relationship.

Referring now to FIG. 8, the method of the present invention for the integer multiple frequency relationship case (n:1) begins in step 70. In step 72, a LFdiv2 signal is generated by frequency dividing the low-frequency clock by two. In step 74, a dLFdiv2 signal is generated by synchronously delaying the LFdiv2 signal by one period of the high-frequency clock. In step 76, a PH1 signal is generated by comparing the values of the LFdiv2 and dLFdiv2 signals. In this embodiment the comparison is an XOR function; the PH1 signal is high when the LFdiv2 and dLFdiv2 signals have different values; the PH1 signal is low when the LFdiv2 and dLFdiv2 signals have the same values. In this method, a rising-edge of the PH1 signal occurs when a rising-edge of the low-frequency clock corresponds to a rising edge of the high-frequency clock. In other words, a low level of the PH1 signal indicates that the next rising-edge of the LFclk clock is also a rising edge of the HFclk clock. The method ends in step 78.

Referring now to FIG. 9, the method of the present invention for the 3:2 frequency relationship case begins in step 80. In step 82, a LFdiv2 signal is generated by frequency dividing the low-frequency clock by two. In step 84, a dLFdiv2 signal is generated by synchronously delaying the LFdiv2 signal by one period of the high-frequency clock. In step 86, a S signal is generated by comparing the values of the LFdiv2 and dLFdiv2 signals. In this embodiment the comparison is an XNOR function; the S signal is low when the LFdiv2 and dLFdiv2 signals have different values; the S signal is high when the LFdiv2 and dLFdiv2 signals have the same values. In step 88, a PH1 signal is generated by sampling the S signal with the high-frequency clock. In this method, a rising-edge of the PH1 signal occurs when a rising-edge of the low-frequency clock corresponds to a rising edge of the high-frequency clock. In other words, a low level of the PH1 signal indicates that the next rising-edge of the LFclk clock is also a rising edge of the HFclk clock. The method ends in step 90.

Implementation in a Computer System

In general, the present invention finds application in digital computer systems to facilitate the transfer of data between devices and buses operating at different frequencies.

Figure 10:
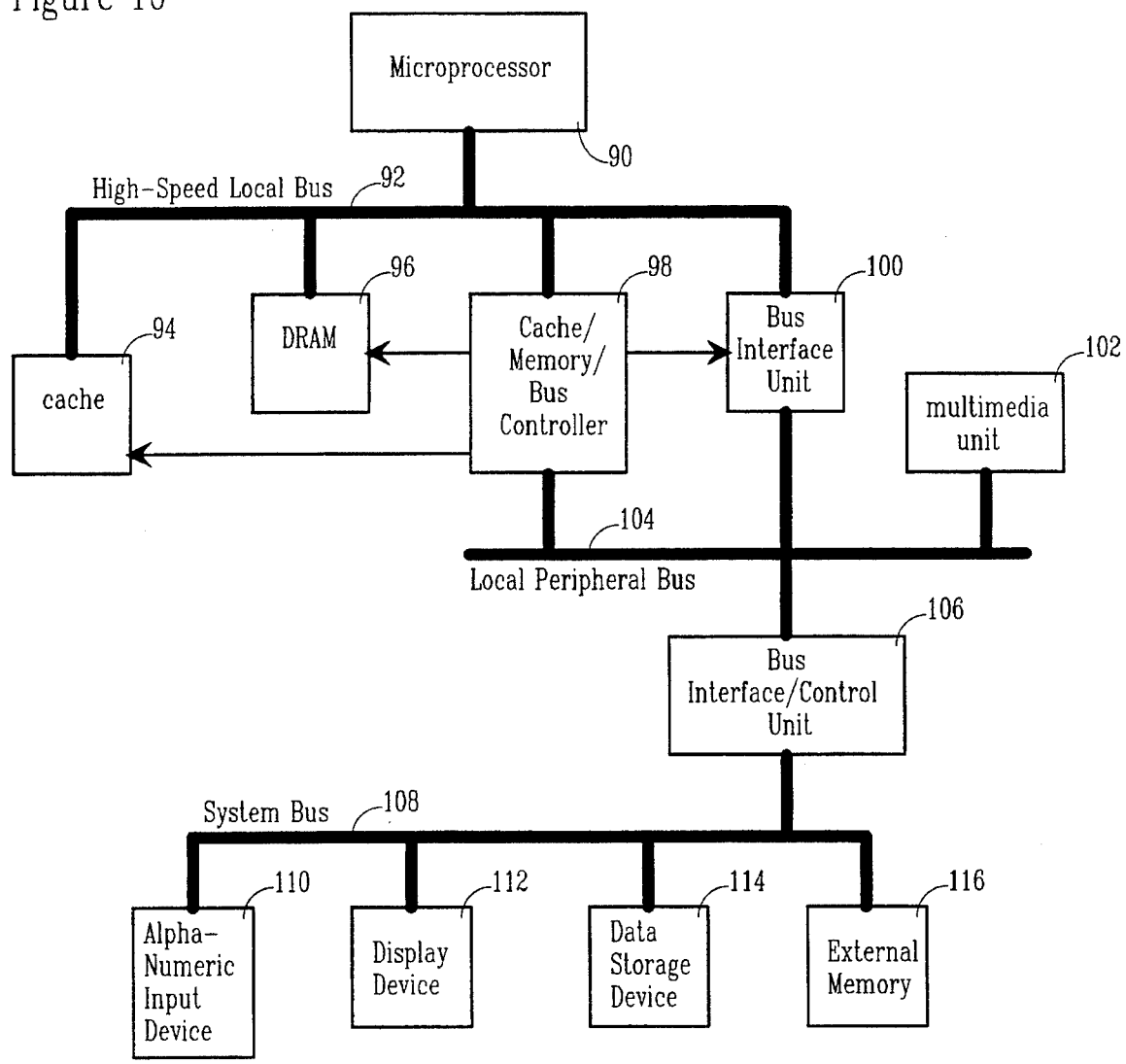
FIG. 10 is a block diagram of a computer system of the present invention.

Referring now to FIG. 10, a computer system incorporating the present invention is shown including a microprocessor 90, a cache 94, a DRAM 96, a cache/memory/bus (CMB) controller 98, and a bus interface unit 100 coupled to a high-speed local bus 92. The CMB controller 98 is also coupled by control signals to the cache 94, DRAM 96, and bus interface unit 100. The CMB controller 98, the bus interface unit 100, and a multimedia unit 102 are coupled to a local peripheral bus 104. A bus interface/control unit 106 is coupled between the local peripheral bus 104 and a system bus 108. An alphanumeric input device 110, a display device 112, a data storage device 114, and an external memory 116 are coupled to the system bus 108. It is understood that not all of these components are necessary for a given computer system implementation.

The bus interface unit 100 transfers data between the high-speed local bus 92 and the local peripheral bus 104. The CMB controller 98 generates control signals to control when the bus interface unit 100 transfers data on the high-speed local bus 92 and the local peripheral bus 104. The CMB controller 98 also generates control signals to control when the cache 94 and the DRAM 96 transfer data on the high-speed local bus 92. The bus interface/control unit 106 controls the transfer of information between the local peripheral bus 104 and the system bus 108.

In the computer system of FIG. 10, the present invention is implemented in the CMB controller 98 to facilitate the transfer of data between the high-speed local bus 92 and the local peripheral bus 104. The high-speed local bus 92 operates at either 66 or 50 MHz and the local peripheral bus 104 operates at 33 MHz. Therefore the frequency relationships of the buses are either 66:33 (2:1) or 50:33 (3:2). Within the CMB controller 98, the present invention detects the phase relationship between a high-frequency clock of the high-speed local bus 92 and a low-frequency clock of the local peripheral bus 104 and generates the control signals to control when the bus interface unit 100 transfers data between the two buses.

EXAMPLE

Suppose that the high-frequency clock of the high-speed local bus 92 operates at 66 MHz and the low-frequency clock of the local peripheral bus 104 operates at 33 MHz. Also suppose that the two clocks are substantially synchronous, i.e. the corresponding edges of the two clocks occur at substantially the same time. Consider that the microprocessor 90 needs to send data to the external memory 116 over the high-speed local bus 92, through the bus interface unit 100, over the local peripheral bus 104, through the bus interface/control unit 106, and over the system bus 108. After the microprocessor has sent the data to the bus interface unit 100 via the high-speed local bus 92, the bus interface unit 100 must know when the local peripheral bus. 104 will be ready to accept the data for transfer to the bus interface/control unit 106. To provide this information, the present invention finds application in the CMB controller 98 to detect the phase relationships between the high-frequency clock of the high-speed local bus 92 and the low-frequency clock of the local peripheral bus 104. The PH1 signal generated by the present invention is coupled between the CMB controller 98 and the bus interface unit 100 to provide the phase relationship information to the bus interface unit 100. When the PH1 signal is low, the bus interface unit knows that the local peripheral bus 104 will be ready to accept information on the next rising edge of the high-frequency clock. Therefore, the present invention provides for efficient transfer of data between units and buses operating at different clock frequencies.

Thus, a system, method, and apparatus for synchronously detecting phase relationships between a high-frequency clock and a low-frequency clock has been described.

What is claimed is:

1. An apparatus for detecting phase relationships between a low-frequency clock and a high-frequency clock, the apparatus comprising:

a first flip-flop having a first data input, a first clock input, a first non-inverting output, and a first inverting output, the first inverting output being coupled to the first data input, the first clock input being coupled to the low-frequency clock, the first non-inverting output being coupled to a first signal;

a second flip-flop having a second data input, a second clock input, and a second non-inverting output, the second data input being coupled to the first signal, the second clock input being coupled to the high-frequency clock, the second non-inverting output being coupled to a second signal; and an XOR gate having a first and second XOR inputs and an XOR output, the first XOR input being coupled to the first signal, the second XOR input being coupled to the second signal, the XOR output being coupled to a first phase signal, a transition of the first phase signal indicating that a first rising edge of the low-frequency clock corresponds to a second rising edge of the high-frequency clock.

2. The apparatus of claim 1 wherein the frequency of the high-frequency clock is an integer multiple of the frequency of the low-frequency clock.

3. An apparatus for detecting phase relationships between a low-frequency clock and a high-frequency clock, the apparatus comprising:

a first flip-flop having a first data input, a first clock input, a first non-inverting output, and a first inverting output, the first inverting output being coupled to the first data input, the first clock input being coupled to the low-frequency clock, the first non-inverting output being coupled to a first signal;

a second flip-flop having a second data input, a second clock input, and a second non-inverting output, the second data input being coupled to the first signal, the second clock input being coupled to the high-frequency clock, the second non-inverting output being coupled to a second signal;

an XNOR gate having a first and second XNOR input and an XNOR output, the first XNOR input being coupled to the first signal, the second XNOR input being coupled to the second signal, the XNOR output being coupled to a third signal; and a third flip-flop having a third data input, a third clock input, and a third non-inverting output, the third data input being coupled to the third signal, the third clock input being coupled to the high-frequency clock, the third non-inverting output being coupled to a first phase signal, a transition of the first phase signal indicating that a first rising edge of the low-frequency clock corresponds to a second rising edge of the high-frequency clock.

4. The apparatus of claim 3 wherein the frequency of the high-frequency clock is 3/2 times the frequency of the low-frequency clock.

* * * * *

UNITED STATES PATENT AND TRADEMARK OFFICE
CERTIFICATE OF CORRECTION

PATENT NO. : 5,553,275
DATED : September 3, 1996
INVENTOR(S) : Brian K. Langendorf It is certified that error appears in the above-identified patent and that said Letters Patent is hereby corrected as shown below:

In the Abstract at [57] in line 4 delete "Lfdiv2" and insert --LFdiv2--

In the Abstract at [57] in line 5 delete "Lfdiv2" and insert --LFdiv2--

In the Abstract at [57] insert --using-- following "compared" and prior to "an"

In column 4 at line 42 delete "PHI" and insert --PH1--

In column 4 at line 46 delete "clock 30." and insert --clock 36.--

In column 8 at line 10 delete "bus." and insert --bus--

Signed and Sealed this

Seventh Day of January, 1997

Attest:

BRUCE LEHMAN

Attesting Officer

Commissioner of Patents and Trademarks